US010362679B2

United States Patent
Gielen

(10) Patent No.: US 10,362,679 B2
(45) Date of Patent: Jul. 23, 2019

(54) LAMP COMPRISING A FLEXIBLE PRINTED CIRCUIT BOARD

(71) Applicant: SIGNIFY HOLDING B.V., Eindhoven (NL)

(72) Inventor: Vincent Stefan David Gielen, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 14/405,174

(22) PCT Filed: May 22, 2013

(86) PCT No.: PCT/IB2013/054230
§ 371 (c)(1),
(2) Date: Dec. 3, 2014

(87) PCT Pub. No.: WO2013/182937
PCT Pub. Date: Dec. 12, 2013

(65) Prior Publication Data
US 2015/0156884 A1 Jun. 4, 2015

Related U.S. Application Data

(60) Provisional application No. 61/654,991, filed on Jun. 4, 2012.

(51) Int. Cl.
*F21V 3/00* (2015.01)
*F21V 3/02* (2006.01)
(Continued)

(52) U.S. Cl.
CPC ............. *H05K 1/189* (2013.01); *F21K 9/232* (2016.08); *F21V 3/00* (2013.01); *F21V 3/02* (2013.01);
(Continued)

(58) Field of Classification Search
CPC .......... F21S 4/001; F21V 3/00; F21V 29/004; F21V 17/00; F21V 29/00; F21V 11/00;
(Continued)

(56) References Cited

U.S. PATENT DOCUMENTS 5,890,794 A * 4/1999 Abtahi ................. B60Q 7/00
362/294
7,434,964 B1 * 10/2008 Zheng et al. ................. 362/294
(Continued)

FOREIGN PATENT DOCUMENTS

CN 101634441 A 1/2010
CN 102216669 A 10/2011
(Continued)

*Primary Examiner* — William N Harris
(74) *Attorney, Agent, or Firm* — Akarsh P. Belagodu

(57) ABSTRACT

The present invention relates to a lamp (1) comprising at least two solid state light sources (9), a envelope (2) comprising a light transmittable surface (3) adapted to transmit light from the solid state light sources, a heat sink (4) extending from inside the envelope to the outer surface of the envelope such that it divides the envelope into at least two compartments (16), and a flexible printed circuit (7) at which the solid state light sources are mounted. The flexible printed circuit is attached to the heat sink such that the solid state light sources are distributed in both of the compartments. The present invention is advantageous in that manufacturing, and in particular assembly, of the lamp is facilitated since the number of components to assemble is reduced and the need of soldering (e.g. of wires to circuit boards) is reduced.

8 Claims, 3 Drawing Sheets

(51) Int. Cl.

| | | |
|---|---|---|
| *F21V 3/06* | (2018.01) | |
| *H05K 1/18* | (2006.01) | |
| *F21K 9/232* | (2016.01) | |
| *F21V 23/00* | (2015.01) | |
| *F21V 29/83* | (2015.01) | |
| *F21V 29/00* | (2015.01) | |
| *F21Y 101/00* | (2016.01) | |
| *F21Y 107/40* | (2016.01) | |
| *F21Y 115/10* | (2016.01) | |
| *F21K 9/60* | (2016.01) | |
| *F21V 29/89* | (2015.01) | |

(52) U.S. Cl.
CPC ............ *F21V 23/009* (2013.01); *F21V 29/83* (2015.01); *F21V 29/89* (2015.01); *F21K 9/60* (2016.08); *F21V 3/0615* (2018.02); *F21V 3/0625* (2018.02); *F21V 29/2212* (2013.01); *F21Y 2101/00* (2013.01); *F21Y 2107/40* (2016.08); *F21Y 2115/10* (2016.08); *H05K 2201/10106* (2013.01)

(58) Field of Classification Search
CPC .... F21V 29/83; F21W 2121/00; F21W 15/02; F21K 9/00; F21K 9/232; F21Y 2101/02; B60Q 1/34; H01L 33/64; H01K 1/58; H01J 61/52
USPC .............................. 362/363, 294, 240, 279.01
See application file for complete search history.

(56) References Cited

U.S. PATENT DOCUMENTS

| | | | | |
|---|---|---|---|---|
| 7,637,636 | B2* | 12/2009 | Zheng | F21S 2/005 362/294 |
| 7,695,162 | B2* | 4/2010 | Zhang | F21S 6/00 362/294 |
| 7,734,964 | B2* | 6/2010 | Nakata | G11B 20/1883 369/53.17 |
| 8,698,290 | B2* | 4/2014 | Masumoto | F21V 3/00 257/678 |
| 8,757,841 | B2* | 6/2014 | Choi et al. | 362/294 |
| 8,801,224 | B2* | 8/2014 | Huang | F21K 9/232 362/227 |
| 8,820,966 | B2* | 9/2014 | Igaki | F21V 3/02 362/249.04 |
| 8,858,029 | B2* | 10/2014 | Brandes | F21V 23/005 362/249.02 |
| 9,933,148 | B2* | 4/2018 | Brandes | F21V 23/005 |
| 10,107,487 | B2* | 10/2018 | Brandes | F21V 23/005 |
| 2005/0174769 | A1* | 8/2005 | Yong | F21V 3/02 362/235 |
| 2005/0207152 | A1 | 9/2005 | Maxik | |
| 2006/0109661 | A1* | 5/2006 | Coushaine | F21K 9/00 362/373 |
| 2006/0193130 | A1* | 8/2006 | Ishibashi | F21V 29/67 362/227 |
| 2008/0100772 | A1* | 5/2008 | Lin | H01L 25/0753 349/61 |
| 2008/0253125 | A1* | 10/2008 | Kang | |
| 2008/0253145 | A1 | 10/2008 | Biarne et al. | |
| 2009/0032290 | A1 | 2/2009 | Yeh et al. | |
| 2009/0045802 | A1* | 2/2009 | Matias | 324/133 |
| 2010/0207502 | A1* | 8/2010 | Cao | F21V 3/00 313/46 |
| 2010/0328947 | A1 | 12/2010 | Chang et al. | |
| 2011/0089838 | A1* | 4/2011 | Pickard | F21V 29/767 315/113 |
| 2011/0156584 | A1* | 6/2011 | Kim | F21K 9/00 315/32 |
| 2011/0254423 | A1* | 10/2011 | Lee | F21K 9/232 313/46 |
| 2012/0075854 | A1* | 3/2012 | Maxik | F21K 9/90 362/235 |
| 2012/0112615 | A1 | 5/2012 | Kuenzler | |

FOREIGN PATENT DOCUMENTS

| | | | |
|---|---|---|---|
| CN | 102224371 A | | 10/2011 |
| JP | 2006244725 A | | 9/2006 |
| JP | 2011523180 A | | 8/2011 |
| JP | 2011192930 A | | 9/2011 |
| JP | 2011253782 A | | 12/2011 |
| JP | 2012509571 A | | 4/2012 |
| KR | 2010044632 A | | 4/2010 |
| WO | 2010058325 A1 | | 5/2010 |
| WO | WO 2010058325 | * | 5/2010 |
| WO | 2012095758 A2 | | 7/2012 |

* cited by examiner

LAMP COMPRISING A FLEXIBLE PRINTED CIRCUIT BOARD

CROSS-REFERENCE TO PRIOR APPLICATIONS

This application is the U.S. National Phase application under 35 U.S.C. § 371 of International Application No. PCT/IB13/054230, filed on May 22, 2013, which claims the benefit of U.S. Provisional Patent Application No. 61/654,991, filed on Jun. 4, 2012. These applications are hereby incorporated by reference herein.

FIELD OF THE INVENTION

The present invention relates to lamps comprising solid state light sources, such as retrofit light emitting diode (LED) lamps, and in particular to LED lamps of the interdigitated type.

BACKGROUND OF THE INVENTION

Conventional incandescent bulb-type lamps are currently being replaced by less energy consuming alternatives, such as LED lamps. Important issues in retrofit LED lamp design are to obtain omnidirectional light distribution resembling the light distribution of an incandescent light bulb and to provide sufficient dissipation of heat generated by the LEDs and the driving electronics.

WO 2010/058325 shows a bulb-type LED lamp having a bulb mounted on a socket. Inside the bulb, a plurality of LEDs are mounted on a printed circuit board (PCB), which is connected to cooling means. The cooling means extends from inside the bulb to the outer surface of the bulb, whereby the outer surface of the bulb is formed both by sub-areas of a light transmittable surface and the cooling means. The sub-areas and the cooling means are preferably arranged in an interdigitated (alternating) configuration. The cooling means and the light transmittable surface form the bulb outer surface, thereby improving heat dissipation from the LEDs as well as the omnidirectional light distribution. However, such lamps give rise to new manufacturing challenges due to the more complex interconnection between the driving electronics and the PCBs caused by their mutual orientation.

SUMMARY OF THE INVENTION

It is an object of the present invention to provide a lamp with improved light distribution and heat dissipating capabilities. It is also an object of the present invention to provide a lamp design facilitating manufacture of the lamp.

These and other objects are achieved by a lamp as defined in the independent claim. Preferred embodiments are defined in the dependent claims.

According to the present invention, the lamp comprises at least two solid state light sources, a envelope comprising a light transmittable surface adapted to transmit light from the solid state light sources and a heat sink (or cooling means) extending from inside the envelope to the outer surface of the envelope such that it divides the envelope into at least two compartments. The lamp further comprises a flexible printed circuit (FPC) at which the solid state light sources are mounted. The FPC is attached to the heat sink such that the solid state light sources are distributed in (both of) the compartments.

With the present invention, the interconnection structure (between the solid state light sources and the driving electronics) is less complex, which facilitates manufacturing and provides more space for the driving electronics.

Thanks to the flexibility of the FPC, the manufacturing of the lamp is further facilitated (and manufacturing costs are reduced) because the need of milling the surfaces of the heat sink, at which surfaces the FPC is mounted, is reduced. In prior art techniques, such surfaces of the heat sink require very high flatness tolerances and therefore have to be milled to a certain flatness to prevent cracks in the PCBs (which typically comprise ceramic boards) which are mounted to the surfaces. Ceramic PCBs are stiff and brittle and may therefore crack if pressed down on an uneven surface with a concentrated force, e.g. exerted by a screw.

The present invention is further advantageous in that the light distribution is improved, as the arrangement of the solid state light sources at the compartment walls (at the heat sink) and the light transmittable surface of the envelope provides a more omnidirectional spatial light distribution. In conventional LED lamps, the desired omnidirectional light distribution is hampered by the base plate (lower wall) at which the LEDs are mounted.

Further, as compared to conventional LED lamps, the present invention is advantageous in that the heat dissipation capacity of the lamp is improved. The extension of the heat sink to the outer surface of the envelope increases the surface of the heat sink exposed to the ambient atmosphere. Moreover, the flexibility of the FPC allows it to better conform to the shape of the heat sink, whereby it may have an increased area, as it may cover non-flat surfaces of the heat sink. An increased area of the FPC provides an increased heat transfer surface of the FPC to the heat sink, which further improves the heat dissipation from the solid state light sources. Further, the increased heat transfer surface of the FPC makes the interface between the FPC and the heat sink less critical, thereby reducing the need of thermal interface material (TIM) between the FPC and the heat sink, which reduces manufacturing costs.

The present invention is further advantageous in that the circuits with the solid state light sources, and preferably the wirings for interconnecting the solid state light sources with the driving electronics, may be integrated to one assembly with the FPC. The FPC can be shaped and adapted to the inner structure of the lamp such that one portion of the FPC, which portion comprises at least one solid state light source, may be attached to the heat sink in one of the compartments, and another portion of the FPC, which portion also comprises at least one solid state light source, may be attached to the heat sink in another compartment. The portion of the FPC interconnecting the two portions may e.g. be bent over a wall or portion of the heat sink separating the compartments. The manufacturing, and in particular assembling, of the lamp is thus facilitated since the number of components to assemble may be reduced and the need of soldering (e.g. of wires to circuit boards) may be reduced. A reduced number of soldered connections also reduces the risk of solder defects.

The present invention is further advantageous in that the FPC is thinner than conventional printed circuit types (e.g. FR4 or IMS) and therefore allows the solid state light sources to be positioned further from the light transmittable surface, which facilitates color mixing when solid state light sources of different colors are used, and makes the luminous intensity over angle more uniform, as the light transmittable surface is more homogeneously radiated.

According to an embodiment of the present invention, the FPC may be a single piece FPC, which is advantageous in that the number of assemblies (or parts) in the lamp is reduced. With the present embodiment, the circuits with the solid state light sources, and preferably the wiring for connecting the solid state light sources to the driving electronics, are integrated in a single FPC. The number of soldered connections is further reduced, as the single FPC reduces the need of soldered connections between the solid state light sources and the driving electronics. According to an alternative embodiment, the FPC may include two or more FPC pieces.

According to an embodiment of the present invention, the FPC may comprise leg portions (or extensions) extending from a mid portion of the FPC and each leg portion may be arranged in one of the compartments. The FPC may e.g. comprise three leg portions if the lamp comprises three compartments such that one leg is arranged in each one of the compartments. The flexibility of the FPC allows the leg portions to be bent down into the different compartments. The mid portion may form a junction for the leg portions to which the wiring from the solid state light sources at each leg may gather. The present embodiment provides a convenient design of the FPC for fitting it into the different compartments and enabling it to be manufactured in a single piece.

According to an embodiment of the present invention, the FPC comprises an interconnection leg portion (or interconnection extension) adapted to be connected to the driving electronics of the lamp. The interconnection leg portion may form a part of the FPC (i.e. be an FPC portion) and comprise wiring connected to the solid state light sources. The end of the interconnection leg portion may comprise interconnection spots which may be soldered (or in another way connected) to the driving electronics. The present embodiment is advantageous in that it reduces the need of separate wiring, and thus also the number of soldered connections, for connecting the solid state light sources to the driving electronics.

According to an embodiment of the present invention, the FPC may cover a major part, such as at least 50%, and preferably at least 80%, and even more preferably at least 90%, of the heat sink surface (or heat sink compartment wall) inside the envelope, thereby increasing the heat transfer surface of the FPC and thus also the heat transfer interface between the FPC and the heat sink. Hence, the heat dissipating capacity of the lamp is improved and the need of TIM between the FPC and the heat sink is further reduced.

According to an embodiment of the present invention, the light transmittable surface may be divided into sub areas by the heat sink. Each sub area may be associated with one of the compartments. With the present embodiment, the light distribution of the lamp may be tuned e.g. via setting of the orientation of the sub areas and the associated sub group of solid state light sources. Further, the sub areas and the heat sink may be arranged in an interdigitated (or alternating) configuration, which is advantageous in that the heat sink is spread (preferably continuously) over the envelope outer surface, thereby further enhancing the heat dissipation capacity. The interdigitated configuration also facilitates manufacturing as it facilitates mounting the light transmittable surface to the heat sink. Moreover, the sub areas may form an integral light transmittable surface, thereby reducing the number of lamp parts, which facilitates assembly of the lamp.

According to an embodiment of the present invention, the heat sink may comprise recesses extending towards a longitudinal axis of the lamp (i.e. inwardly, towards the middle of the lamp). It will be appreciated that the longitudinal axis (or optical axis) of the lamp extends through a central end of a socket (or base or lower part) of the lamp and a central extremity of the envelope. The present embodiment is advantageous in that the outer surface area of the heat sink is increased, which improves the heat dissipation from the heat sink. Alternatively, the heat sink may be solid, i.e. without recesses, which facilitates manufacture (machining and casting) of the heat sink.

According to an embodiment of the present invention, the FPC may comprise a reflective solder resist, which is advantageous in that it increases the light output from the lamp, as the reflective solder resist then reflects light from the solid state light sources out of the lamp. With the present embodiment, the need of a separate reflector part is reduced, which reduces costs and complexity of the lamp.

According to an embodiment of the present invention, the FPC may be attached to the heat sink by means of an adhesive. For example, an adhesive layer may be coated on the FPC and/or heat sink for the attachment of the FPC to the heat sink. The present embodiment is advantageous in that it reduces the need of a screw for attaching the FPC to the heat sink and thereby facilitates assembly.

It is noted that the invention relates to all possible combinations of features recited in the claims. Further objectives of, features of, and advantages with, the present invention will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

The above and other aspects of the present invention will now be described in more detail, with reference to the appended drawings showing embodiments of the invention.

All the figures are schematic, not necessarily to scale, and generally only show parts which are necessary in order to elucidate the invention, wherein other parts may be omitted or merely suggested.

DETAILED DESCRIPTION

Figure 1:
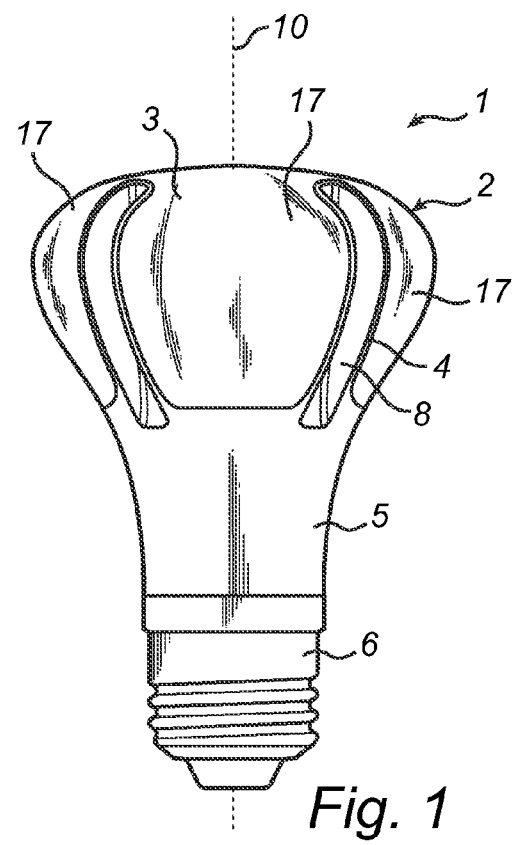
FIG. 1 shows a lamp according to an embodiment of the present invention.

A lamp 1 according to an embodiment of the present invention will be described with reference to FIGS. 1-4. Referring first to FIG. 1, the lamp 1 comprises a bulb 2, in which LEDs 9 (not shown in FIG. 1, but in FIGS. 2 and 3), or any other kind of solid state light sources, are arranged and a socket 6 adapted to be fitted in a lamp fitting. The socket 6 is mounted to bulb 2 such that a longitudinal axis 10 (or optical axis) of the lamp 1 extends through a central end of the socket 6 and a central extremity of the bulb 2. The lamp 1 further comprises a light transmittable (or transmissive) surface 3, which forms a part of the bulb 2 and is adapted to transmit light from the LEDs 9. The light transmittable surface 3 may be made of a transparent or semi-transparent material, such as glass (or any other ceramic) or plastics, and may preferably be diffuse (frosted) for reducing the risk of glare of the LEDs 9 and improving color mixing (if different colored LEDs are used), light homogeneity and light distribution over angle (IoA). In the described embodiments, the envelope is bulb-shaped and therefore also referred to as bulb. However, the invention is not restricted to envelopes that are bulb-shaped; each envelope with the required functionality falls under the scope of the present invention.

Figure 2:
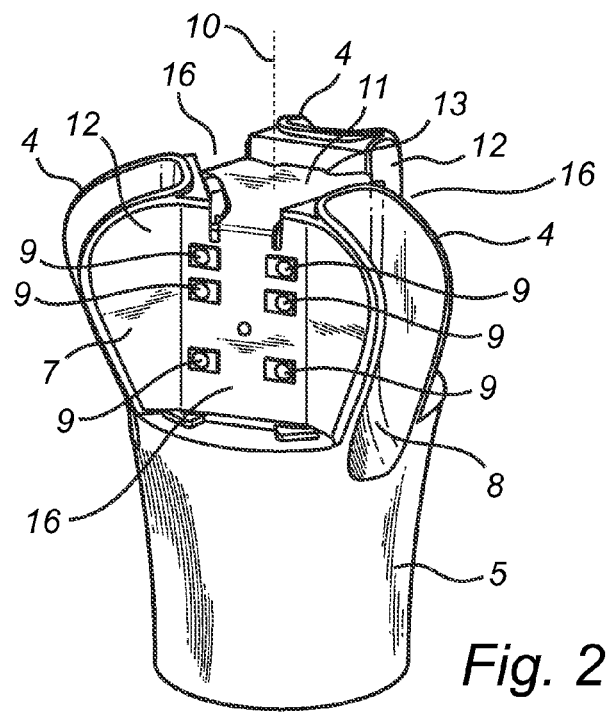
FIG. 2 shows a heat sink and a FPC of the lamp shown in FIG. 1.

For cooling the LEDs 9 and the driving electronics (not shown), the lamp 1 comprises a heat sink 4 extending from inside the bulb 2 to the outer surface of the bulb 2 such that it divides the bulb 2 into a number of compartments 16 (shown in FIG. 2). Accordingly, the walls of the enclosure defined by a compartment 16 are formed by the surfaces of the heat sink 4 and the light transmittable surface 3. The heat sink 4, and in particular the outer edges of the heat sink 4 walls, divides the light transmittable surface 3 into sub areas 17, which preferably may be integral and form a single piece of material. The sub areas 17 may extend from a mid portion of the light transmittable surface 3 (the mid portion being on top of the bulb 2). As illustrated in FIG. 1, the sub areas 17 and the heat sink 4 may be arranged in an interdigitated (or forked) configuration, wherein the sub areas 17 and the heat sink 4 (or the outer edges of the heat sink 4) are alternately arranged. Together, the heat sink 4 and the light transmittable surface 3 form the outer surface of the bulb 2.

For increasing the heat dissipating area of the heat sink 4, which is exposed to the ambient atmosphere, the heat sink 4 may comprise recesses 8 extending towards the longitudinal axis 10 of the lamp 1 and the longitudinal direction of which may be substantially parallel with the longitudinal axis 10. The recesses 8 may thus form grooves with a concave form in the (outer surface of) the bulb 2.

The lamp 1 may further comprise a bottom heat sink 5, which preferably may be made (casted) in the same piece of material as the heat sink 4 of the bulb 2, thereby reducing the number of parts in the lamp 1 and increasing the heat transfer from the bulb to the bottom heat sink 5. Alternatively, the bottom heat sink 5 and the heat sink 4 of the bulb 2 may be made as separate parts. The heat sink 4 and the bottom heat sink 5 are preferably made of metal with a thermal conductivity of 70-200 W/mK, such as magnesium or aluminium, or any material having a thermal conductivity of at least 20 W/mK.

The design of the lamp 1, in particular with respect to the heat sink 4 (or cooling means), the light transmittable surface 3, the bulb 2 and the socket 6, may be made according to the disclosure of WO 2010/058325, and in particular according to FIGS. 2A-3B and the corresponding part of the description of WO 2010/058325, which disclosure hereby is incorporated by reference.

Figure 3:
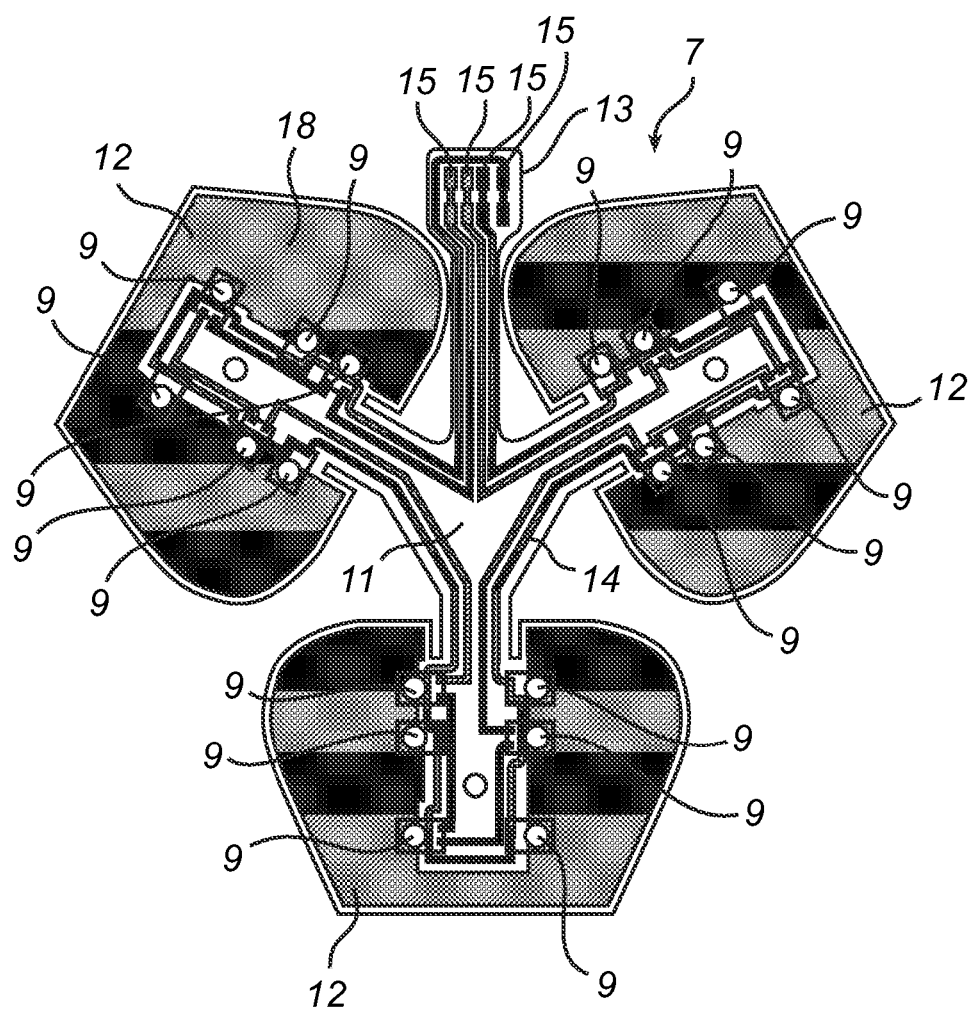
FIG. 3 shows the FPC of FIG. 2 in a plane, non-folded state.

Turning now to FIGS. 2 and 3, the lamp 1 further comprises a FPC (flexible printed circuit) 7 at which the LEDs 9 are attached (e.g. by soldering). In FIG. 2, the FPC 7 is applied to the heat sink 4 of the lamp 1, and in FIG. 3, the FPC 7 is shown in a plane, non-folded and non-applied state or, in other words, in a deployed state. The FPC 7 comprises a flexible substrate comprising e.g. PET (polyethylene terephthalate), PEN (polyethylene naphthalate) or PI (polyimide), at which the electric components, including wiring 14 (or copper tracks), shown in FIG. 2, and the LEDs 9, are applied. The wiring 14 is adapted to connect the LEDs 9 to the driving electronics. Preferably, the FPC comprises a copper coating 18 (shown in FIG. 3) with a thickness of about 35-100 µm, and preferably about 70 µm, for enhancing the heat dissipation from the FPC. For increasing the reflection of light from the LEDs 9 out of the lamp 1, the FPC may comprise a reflective (such as white) solder resist.

The FPC 7 may preferably be made of a single piece comprising leg portions 12 and an interconnection leg portion 13 extending from a mid portion 11 (or junction portion) of the FPC 7. The LEDs 9 are mounted at the leg portions 12 and the wiring 14 extends from the LEDs 9 via the mid portion 11 to the interconnection leg portion 13. At the end of the interconnection leg portion 13, interconnection spots or pads 15 for connecting the FPC 7 to the driving electronics (e.g. by soldering or a connector) are arranged.

The FPC is attached to the heat sink 4, preferably by an adhesive, such that each leg portion 12 is arranged in one of the compartments 16. Each leg portion 12 is thus bent over the upper edge of the heat sink 4 and the interconnection leg portion 13 is bent down into a compartment inside (in the middle of) the heat sink 4, in which compartment the driving electronics is arranged. The FPC 7 may cover a major part, such as at least 80%, of the heat sink surface inside the bulb 2, and preferably, each leg portion 12 may have approximately the same size (area) as the corresponding heat sink compartment wall (or surface) it is attached to (as illustrated in FIG. 2) for providing largest possible heat transfer surface.

Figure 4:
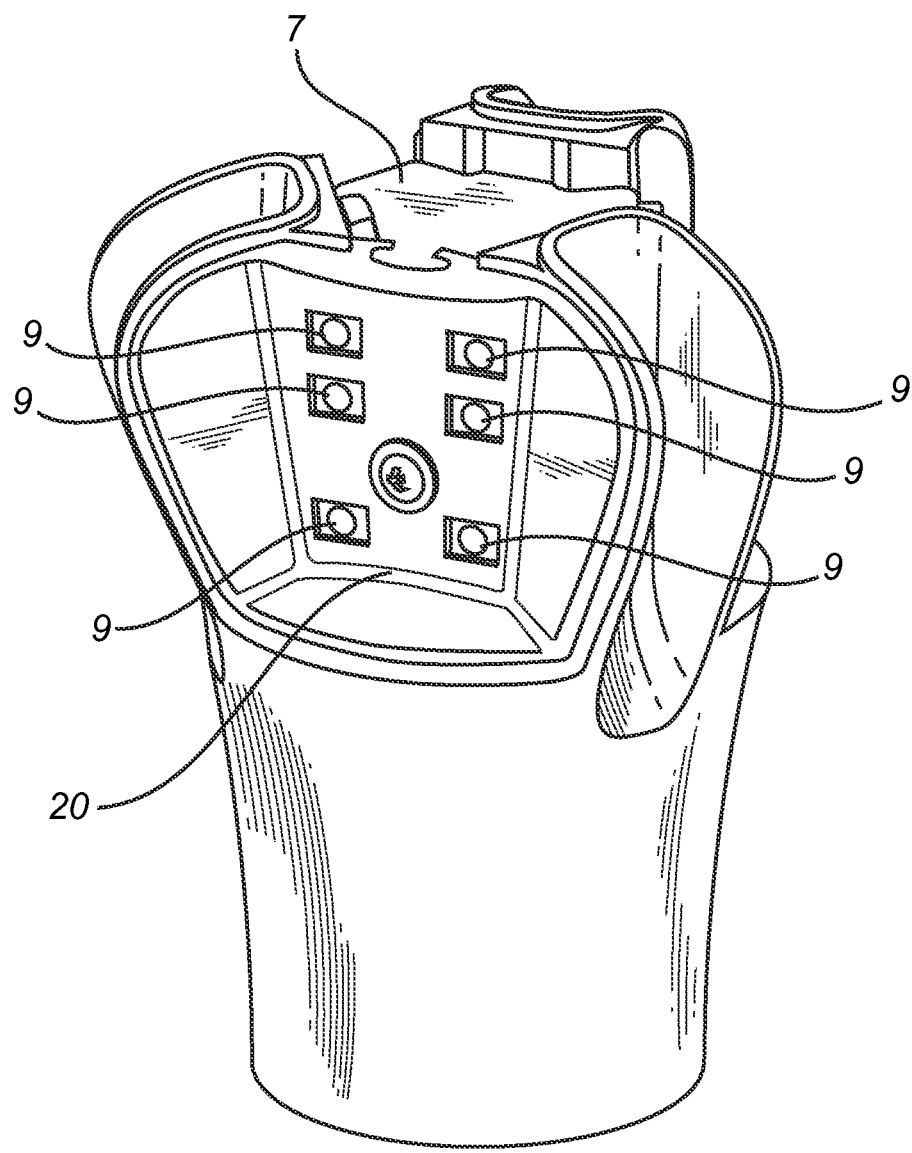
FIG. 4 shows the lamp provided with a reflector according to an embodiment of the present invention.

According to an embodiment, the lamp 1 may comprise at least one (separate) reflector 20 arranged in at least one of the compartments, preferably such that the reflector covers the FPC 7 (with openings for the solid state light sources 9), as shown in FIG. 4. Hence, the FPC 7 may be arranged between the heat sink 4 and the reflector 20. The present embodiment is advantageous in that the FPC 7 is thinner than conventional PCB types (such as FR4 or IMS) and therefore requires less space between the reflector and the heats sink. Further, in prior art techniques using conventional PCBs, the wires soldered to the PCB absorb light and must therefore be covered by the reflector, which thus bulges into the optical chamber. A bulging reflector is disadvantageous in that it is more directly illuminated by the solid state light sources (due to its proximity to the solid state light sources). However, it is desirable that only light scattered back from the diffused light transmittable surface should be reflected by the reflector. With the present embodiment, such bulge in the reflector is not necessary since the FPB 7 is thinner and flatter than conventional PCB solutions. Hence, the direct illumination of the reflector 20 is reduced, which is advantageous in that it reduces reflection losses.

The person skilled in the art realizes that the present invention by no means is limited to the preferred embodiments described above. On the contrary, many modifications and variations are possible within the scope of the appended claims.

The invention claimed is:
1. A lamp comprising:
at least two solid state light sources;
an envelope comprising a light transmittable surface adapted to transmit light from the solid state light sources;
a heat sink extending from inside the envelope to the light transmittable surface of the envelope such that it divides the envelope into at least two compartments; and
a flexible printed circuit at which the solid state light sources are mounted and which is adapted to be connected to driving electronics of the lamp, wherein the flexible printed circuit comprises a plurality of leg portions and a mid-portion, wherein the plurality of leg portions of the flexible printed circuit are integrally formed with and extend from the mid-portion of the flexible printed circuit, and wherein each leg portion is respectively arranged in one of the compartments and an outer surface of each leg portion is substantially concave, wherein at least two of the leg portions of the flexible printed circuit are each attached to the heat sink such that the solid state light sources are distributed in the compartments.

2. A lamp as defined in claim 1, wherein the flexible printed circuit covers a major part of the heat sink surface inside the envelope.

3. A lamp as defined in claim 1, wherein the light transmittable surface is divided into sub areas by the heat sink.

4. A lamp as defined in claim 3, wherein the sub areas and the heat sink are arranged in an interdigitated configuration.

5. A lamp as defined in claim 1, wherein the heat sink comprises recesses extending towards a longitudinal axis of the lamp.

6. A lamp as defined in claim 1, wherein the flexible printed circuit comprises a reflective solder resist.

7. A lamp as defined in claim 1, wherein the flexible printed circuit is attached to the heat sink by means of an adhesive.

8. A lamp, comprising:
at least two solid state light sources;
an envelope comprising a light transmittable surface adapted to transmit light from the solid state light sources;
a heat sink extending from inside the envelope to the light transmittable surface of the envelope such that it divides the envelope into at least two compartments such that the at least two compartments are separated by one or more walls of the heat sink; and
a flexible printed circuit at which the solid state light sources are mounted and which is adapted to be connected to driving electronics of the lamp, wherein the flexible printed circuit comprises a plurality of leg portions and a mid-portion, wherein the plurality of leg portions of the flexible printed circuit are integrally formed with and extend from the mid-portion of the flexible printed circuit, and wherein each leg portion is respectively arranged in one of the compartments, wherein at least two of the leg portions of the flexible printed circuit are each attached to the heat sink such that the solid state light sources are distributed in the compartments and each of the at least two of the leg portions has approximately a same size as the corresponding compartment to which it is attached.

* * * * *